United States Patent
Engelhart et al.

(10) Patent No.: US 8,680,655 B2
(45) Date of Patent: Mar. 25, 2014

(54) PRODUCTION PROCESS FOR A SEMI-CONDUCTOR DEVICE AND SEMI-CONDUCTOR DEVICE

(75) Inventors: Peter Engelhart, Hameln (DE); Stefan Bordihn, Leipzig (DE); Maximillian Scherff, Dortmund (DE); Bernhard Kloter, Leipzig (DE)

(73) Assignee: Hanwha Q Cells GmbH, Frankfurt am Main (DE)

( * ) Notice: Subject to any disclaimer, the term of this patent is extended or adjusted under 35 U.S.C. 154(b) by 16 days.

(21) Appl. No.: 13/198,789

(22) Filed: Aug. 5, 2011

(65) Prior Publication Data

US 2012/0032310 A1 Feb. 9, 2012

(30) Foreign Application Priority Data

Aug. 6, 2010 (DE) .......................... 10 2010 036 893

(51) Int. Cl.
*H01L 29/04* (2006.01)
*H01L 21/00* (2006.01)

(52) U.S. Cl.
USPC ........................................... 257/632

(58) Field of Classification Search
USPC .................. 136/255, 256, 261; 257/618, 632; 438/71, 514
See application file for complete search history.

(56) References Cited

U.S. PATENT DOCUMENTS

| | | | |
|---|---|---|---|
| 2006/0125882 A1* | 6/2006 | Hess et al. | 347/61 |
| 2009/0056798 A1* | 3/2009 | Merchant et al. | 136/256 |
| 2009/0233426 A1* | 9/2009 | Poplavskyy et al. | 438/502 |
| 2010/0240170 A1* | 9/2010 | Sun | 438/72 |
| 2010/0319763 A1* | 12/2010 | Park et al. | 136/255 |

* cited by examiner

*Primary Examiner* — Ha Tran T Nguyen
*Assistant Examiner* — Ismail Muse
(74) *Attorney, Agent, or Firm* — William J. Sapone; Ware Fressola; Maguire & Barber LLP

(57) ABSTRACT

A process for producing a semiconductor device comprises the following process steps: provision of a semiconductor substrate (1); formation of a functional layer (2) on a semiconductor surface (11) of the semiconductor substrate (1); and production of at least one doped section (3) on the semiconductor surface (11) by driving a dopant into the semiconductor substrate (1) from the functional layer (2). The functional layer (2) is formed in such a way that it passivates the semiconductor surface (11), acting as a passivation layer upon completion of the semiconductor device.

13 Claims, 1 Drawing Sheet

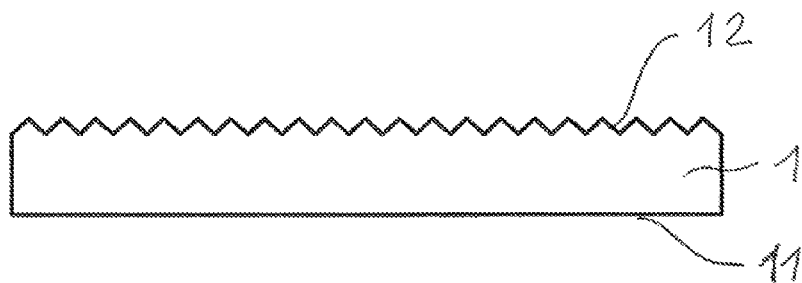
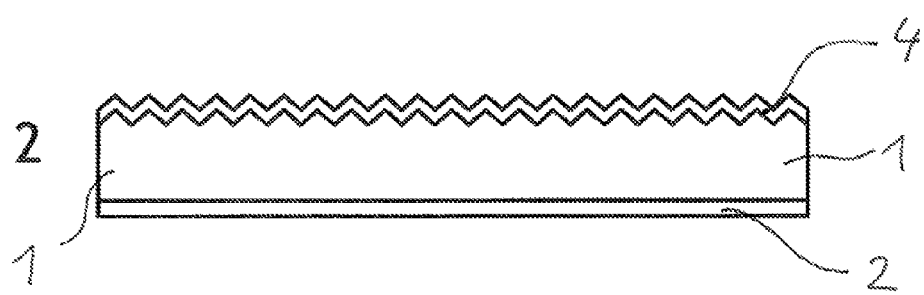
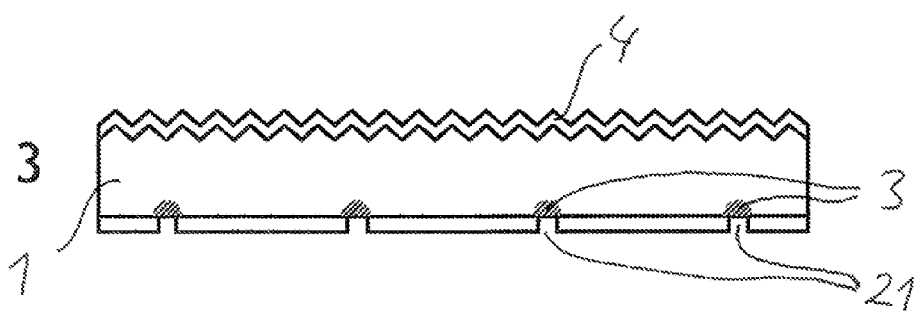
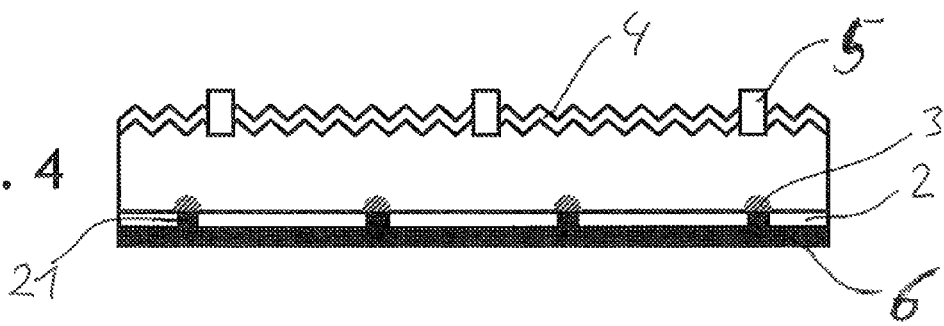

PRODUCTION PROCESS FOR A SEMI-CONDUCTOR DEVICE AND SEMI-CONDUCTOR DEVICE

TECHNICAL FIELD

The invention relates to a production process of a semiconductor device, and to a semiconductor device. In particular, the invention relates to a production process of a solar cell, and to a solar cell.

BACKGROUND

In semiconductor device production, and in particular in the production of solar cells, doped sections are produced on a semiconductor substrate by means of doping or deposition, said doped sections forming with the substrate material, depending on the purpose of application, a pn junction, a $pp^+$ junction or an $nn^+$ junction. In the case of photovoltaic elements such as solar cells, for example, a pn junction can serve for separating free charge carriers generated upon the incidence of light. By contrast, $pp^+$ junctions or $nn^+$ junctions are so-called high-low junctions which, arranged below a metal contact, allow improved contacting of the semiconductor device, and, secondly, can also lead to a reduced recombination activity and thus to a higher efficiency of the semiconductor device.

Such junctions can be produced on the front and/or rear side of the semiconductor device. By way of example, they can be formed by means of locally doped sections, in particular by means of locally highly doped sections, as is the case for example for so-called selective emitters. Such local dopings are usually introduced with the aid of laser-induced diffusion processes. One example thereof is constituted by, inter alia, the alloying of aluminum from a metal layer into an underlying semiconductor substrate by means of point-type laser irradiation. This alloying process also proceeds during the laser-induced contacting of an aluminium film with a semiconductor substrate, the result of which is designated as a laser-fired contact (LFC).

Further known processes for producing local dopings are local diffusion from a diffusion source applied locally to the semiconductor substrate or local diffusion through a diffusion mask. However, such processes are generally complex and expensive, either since they require expensive diffusion sources or because the masking is complex. Moreover, the process windows for such processes are often small. Furthermore, there is often the problem that, after the doping step, a further functional layer has to be applied on the doped semiconductor substrate, for example a passivating layer or a reflection or antireflection layer. In order then to be able to contact the doped sections, contact openings have to produced through the functional layer, said contact openings being aligned exactly with the doped regions.

SUMMARY OF THE INVENTION

Therefore, it is an object of the invention to provide a production process of a semiconductor device, and a semiconductor device, wherein doped semiconductor sections are produced in an efficient and cost-effective manner, in particular with regard to alignment of functional layer openings with said doped semiconductor sections which is effected as exactly as possible.

The object is achieved according to the invention by means of a production process of a semiconductor device comprising the features of Claim 1 and by means of a semiconductor device comprising the features of Claim 14. Advantageous developments of the invention are presented in the dependent claims.

The invention is based on the insight that a functional layer applied on a semiconductor surface of the semiconductor substrate during the production of the semiconductor device simultaneously functions as a supplier for the dopant, which serves for the doping of the semiconductor substrate below the functional layer, in order thus to produce a doped section. The functional layer applied passivates the semiconductor surface of the semiconductor substrate at the end of the production process and furthermore as a passivation layer. For the purpose of doping the semiconductor substrate, the dopant is driven into the semiconductor substrate from the functional layer at envisaged sections of the semiconductor surface.

The passivation effect is maintained by the functional layer acting as a passivation layer substantially only at the sections which adjoin the semiconductor surface and which are not the doped sections. In other words, at part of the semiconductor surface, dopant is driven into the semiconductor substrate from the overlying functional layer, while at the remaining part of the semiconductor surface the functional layer later acts as a passivation layer. The passivation effect can therefore be reduced or even destroyed at the doped sections on account of the process of driving in the dopant. It is even possible for the functional layer to be partly or completely destroyed at the associated locations on account of the driving-in process.

The passivation layer formed by the functional layer passivates the semiconductor surface by means of a chemical passivation and/or by means of a field effect passivation. While in the former mechanism recombination centres such as, for example, free bonds (so-called dangling bonds) are removed on account of the passivation layer, the recombination activity in the case of field effect passivation is reduced by free charge carriers being forced away from the semiconductor surface.

One preferred embodiment provides for the dopant to be driven into the semiconductor substrate from the functional layer by means of an energy input. The energy input is preferably effected in a localized manner, to be precise only at the locations on the functional layer below which doped sections are intended to be produced. Given a suitable energy input, the semiconductor substrate can be locally melted at the semiconductor surface, as a result of which the dopant is diffused into the molten semiconductor substrate.

Expediently, the dopant is driven into the semiconductor substrate from the functional layer by means of a laser source. In this case, it is possible to use laser sources having spot sizes or diameters of between approximately 10 nm and 100 nm, preferably between approximately 10 nm and 50 nm. The laser beams used can furthermore have a fluence or energy density of up to 0.1 to 10 $J/cm^2$, preferably of up to 0.2 to 2 $J/cm^2$, more preferably up to a value of between approximately 0.5 and 1.5 $J/cm^2$. The wavelengths of the lasers used for this purpose are preferably between approximately 300 nm and 1200 nm, more preferably between approximately 300 nm and 600 nm. Advantageously, in particular for cost reasons, it is possible to use wavelength ranges in the visible range or between approximately 400 nm and 600 nm. The three laser parameters presented in this paragraph can be chosen independently of one another.

It is preferably provided that the energy input forms an opening in the functional layer which serves as a passivation layer opening in the passivation layer upon completion of the semiconductor device. One advantage here is that the passivation layer openings thus formed are aligned on the doped sections produced by means of the energy input. In other words, self-alignment is involved here.

One expedient embodiment provides for a contact layer to be applied on the functional layer which electrically contacts the semiconductor substrate at the doped section through the opening. The contact layer can in this case be a metal layer which is applied to the functional layer by means of a deposition process or some other suitable process and in this case penetrates into the opening. Therefore, a contact opening is formed at the same time as the production of the doped section.

In one advantageous configuration, it is provided that prior to the step of driving-in, the dopant is present in a compound of a functional layer material, out of which the functional layer is formed. Preferably, said compound is cleaved by means of the energy input, which subsequently brings about the driving-in of the cleaved dopant.

In accordance with one preferred development, it is provided that the functional layer is made of a metal oxide. By way of example, the functional layer can be made of aluminium oxide ($AlO_x$) or comprise aluminium oxide, wherein the dopant aluminium is present in a compound. In a semiconductor substrate made of silicon, an indiffusion of aluminium produces a p-type doping.

Further advantageous functional layer materials are, for example, titanium oxide ($TiO_x$), magnesium oxide ($MgO_x$) or tin oxide ($ZnO_x$), wherein titanium, magnesium or tin correspondingly functions as a dopant and is indiffused or driven into the semiconductor substrate for the purpose of producing the doped section.

In accordance with one preferred configuration, it is provided that immediately before the functional layer is formed, the semiconductor substrate comprises at the semiconductor surface essentially the same doping as in the volume of the semiconductor substrate. This means that, before the functional layer is applied, the semiconductor surface is undoped or has the bulk doping of the semiconductor substrate.

As an alternative thereto, before the functional layer is formed, one or a plurality of doping sections are produced on the semiconductor surface, the doping of which are increased and/or inverted locally by way of said driving-in of the dopant from the functional layer into the semiconductor substrate. To put it another way, before the functional layer is applied, doping regions are produced in or on the semiconductor substrate, for example by means of the doping of the semiconductor substrate on the semiconductor surface and/or by means of the deposition of the doping regions onto the semiconductor surface. The doping region produced by means of doping or by means of deposition can be a doping layer which preferably covers the entire semiconductor surface. By means of the driving-in, the dopant is then indiffused into said doping section or into said doping sections, as a result of which a local increase and/or inversion of the doping sections is achieved.

One expedient development provides for the semiconductor substrate to be a p-type or n-type semiconductor in its volume. By way of example, the semiconductor substrate can be a predoped semiconductor wafer. The fact that the semiconductor substrate is a p-type or n-type semiconductor in its volume means that a thin layer along the semiconductor surface can have an increased or opposite doping relative to the volume. In this case, by way of example, a pn junction or a $pp^+$ junction or an $nn^+$ junction can be formed before the functional layer is applied.

The production process described herein preferably involves the production of a semiconductor solar cell out of the semiconductor substrate. This process is readily applicable in particular to the production of so-called PERC solar cells (PERC—"Passivated Emitter and Rear Cell"). In this case, as also in all of the other embodiments, the application of the functional layer and the driving-in of the dopant into the underlying semiconductor substrate from the functional layer can be effected on one side or on both sides of the semiconductor substrate, that is to say—in the case of a semiconductor solar cell—on the light incidence side and/or on the rear side facing away from the light incidence.

BRIEF DESCRIPTION OF THE DRAWINGS

The invention is explained below on the basis of exemplary embodiments with reference to the figures, which illustrate a sequence of process steps on the basis of intermediate products. In this case, in the figures:

FIG. 1 schematically shows a semiconductor substrate having a textured surface;

FIG. 2 schematically shows the semiconductor substrate from FIG. 1 with a functional layer applied on the rear side;

FIG. 3 shows the semiconductor substrate from FIG. 2 after a step of locally driving in a dopant into the semiconductor substrate from the functional layer; and FIG. 4 shows a solar cell with front and rear contacting, completed from the semiconductor substrate in accordance with FIG. 3.

DETAILED DESCRIPTION OF THE INVENTION

A solar cell production process is described below. However, the process steps explained can also be correspondingly applied to other semiconductor devices that require a passivation of their surfaces in order to increase the efficiency.

FIG. 1 shows a semiconductor substrate 1 having a semiconductor surface 11, on which a functional layer is intended to be applied. The semiconductor surface 11 is situated on a side of the semiconductor substrate 1 which faces away from the incident light during later use of the finished solar cell. A texturing is formed on a further semiconductor surface 12 of the semiconductor substrate 1, on the light incidence side, which is illustrated by the zigzag representation. The texturing is generally achieved by means of a texture etch and serves to trap the incident light more efficiently.

In a subsequent step, a functional layer 2 is applied to the semiconductor surface 11, for example by means of a chemical or physical deposition process such as CVD or PVD (chemical or physical vapour deposition), if appropriate plasma enhanced (PECVD, "plasma enhanced chemical vapour deposition"), or by means of atomic layer deposition (ALD). The result of the semiconductor substrate 1 with a functional layer 2 applied on the rear side is illustrated in FIG. 2, wherein it can also be discerned that a further passivation layer 4 is applied on the further semiconductor surface 12 on the light incidence side. Alternatively or additionally, the layer applied on the light incidence side can also comprise an antireflection layer in order to reduce the reflection of the incident light.

In a further step, the semiconductor surface 1 is locally treated with laser radiation in order, at the irradiated sections, to drive a dopant into the semiconductor substrate 1 from the functional layer 2. As a result of the penetration of the dopant into the semiconductor substrate 1, the semiconductor material is doped at the irradiated sections, such that doped sections 3 arise there at the semiconductor surface 11.

As illustrated in FIG. 3, as a consequence of the irradiation, openings 21 additionally arise in the functional layer, which are inevitably aligned on the doped sections 3 produced. Depending on the intensity of the laser radiation and, if appropriate, on other parameters, the doped sections 3 can also extend in part below the remaining functional layer. To put it another way, the extent of a doped section 3 along the semiconductor surface 11 can be greater than the extent of the associated opening 21.

As illustrated in FIG. 4, the solar cell is contacted on the front and rear sides in a subsequent contacting step. While a front-side metallization 5 in the form of metal strips is applied on the further passivation layer 4 on the light incidence side, the functional layer 2 or passivation layer 2 on the rear side of the solar cell is covered over the whole area with a contact layer 6 as rear-side metallization. In this case, the contact layer 6 penetrates into the openings 21 in the passivation layer 2 and thus produces an electrical contact with the doped sections 3.

In the embodiment illustrated here, doped sections 3 are formed by means of the laser-induced driving of the dopant into the semiconductor substrate 1, said doped sections reducing the contact resistance between the semiconductor substrate 1 and the rear-side metallization 6. The pn junction responsible for charge carrier separation, by contrast, is not illustrated in FIGS. 1 to 4. However, such junctions which are responsible for the separation of the free charge carriers produced by light incidence can also be produced by means of the method described.

LIST OF REFERENCE SYMBOLS

1 Semiconductor substrate
11 semiconductor surface
12 further semiconductor surface
2 Functional layer (passivation layer)
21 opening
3 Doped section
4 Further passivation layer
5 Front-side metallization
6 Contact layer (rear-side metallization)

The invention claimed is:

1. A process for producing a semi-conductor device, comprising the following process steps:
    forming a metal oxide functional layer on a semi-conductor surface of the semi-conductor substrate;
    cleaving metal dopant from the metal oxide by applying an energy input to at least one section of the functional layer; and
        driving in the cleaved metal dopant into the semi-conductor substrate for producing at least one doped section on the semi-conductor surface, wherein the step of applying the energy input and driving-in the cleaved dopant forms at least one opening in the functional layer.

2. The process according to claim 1, characterized in that the cleaved dopant is driven into the semi-conductor substrate from the functional layer by a localized energy input.

3. The process according to claim 2, characterized in that the localized energy input is provided using a laser source.

4. The process according to claim 1, further wherein the step of applying the energy input and driving-in the cleaved dopant forms an opening through the functional layer at each of the at least one section of the functional layer.

5. The process according to claim 4, further comprising applying a contact layer on the functional layer which electrically contacts the semi-conductor substrate at the doped section through the opening.

6. The process according to claim 1, characterized in that the functional layer is made of a metal oxide.

7. The process according to claim 6, characterized in that the functional layer comprises aluminum oxide and that the cleaved dopant comprises aluminum.

8. The process according to claim 1, characterized in that immediately before the functional layer is formed, the semi-conductor substrate contains at the semi-conductor surface essentially the same amount of a dopant as present in a volume of the semi-conductor substrate.

9. The process according to claim 1, further comprising, before the step of forming the functional layer, producing doping sections on the semi-conductor surface, the doping in the doping sections being increased and/or inverted locally by said driving-in of the cleaved dopant from the functional layer into layer into the semi-conductor substrate.

10. The process according to claim 1, characterized in that the semi-conductor substrate is a p-type or n-type semi-conductor in its volume.

11. The process according to claim 1, further comprising forming a semi-conductor solar cell out of the semi-conductor substrate.

12. The process according to claim 2, further wherein the step of applying the energy input and driving-in the cleaved dopant forms an opening through the functional layer at each of the at least one section of the functional layer.

13. The process according to claim 3, further wherein the step of applying the energy input and driving-in the cleaved dopant forms an opening through the functional layer at each of the at least one section of the functional layer.

* * * * *